US009330788B2

(12) United States Patent
Anzou

(10) Patent No.: US 9,330,788 B2
(45) Date of Patent: May 3, 2016

(54) SEMICONDUCTOR INTEGRATED CIRCUIT CAPABLE OF PERFORMING SELF-TEST

(71) Applicant: Kabushiki Kaisha Toshiba, Minato-ku, Tokyo (JP)

(72) Inventor: Kenichi Anzou, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/481,161

(22) Filed: Sep. 9, 2014

(65) Prior Publication Data

US 2015/0262709 A1    Sep. 17, 2015

(30) Foreign Application Priority Data

Mar. 14, 2014   (JP) .................................. 2014-051714

(51) Int. Cl.
*G11C 29/44*       (2006.01)
*G11C 7/10*        (2006.01)
*G11C 29/04*       (2006.01)
*G11C 29/12*       (2006.01)

(52) U.S. Cl.
CPC .......... *G11C 29/4401* (2013.01); *G11C 7/1006* (2013.01); *G11C 2029/0405* (2013.01); *G11C 2029/0407* (2013.01); *G11C 2029/0409* (2013.01); *G11C 2029/1208* (2013.01)

(58) Field of Classification Search
CPC .............................. G11C 29/36; G11C 7/1006
USPC ............. 714/719, 733, 742; 365/189.07, 200, 365/201
See application file for complete search history.

(56) References Cited

U.S. PATENT DOCUMENTS

| 5,784,323 | A  | 7/1998  | Adams et al. |
| 7,653,854 | B2 | 1/2010  | Anzou et al. |
| 8,032,803 | B2 | 10/2011 | Anzou et al. |

FOREIGN PATENT DOCUMENTS

| JP | H05-165737 | A  | 7/1993  |
| JP | H08-328964 | A  | 12/1996 |
| JP | 2006-039843 | A | 2/2006  |
| JP | 4455547    | B2 | 2/2010  |
| JP | 4455623    | B2 | 2/2010  |

*Primary Examiner* — Alexander Sofocleous
*Assistant Examiner* — Alfredo Bermudez Lozada
(74) *Attorney, Agent, or Firm* — Knobbe, Martens, Olson & Bear, LLP

(57) ABSTRACT

According to one embodiment, there is provided a semiconductor integrated circuit including a memory, a capture register, a writing unit, and a control unit. The memory includes a plurality of memory bit cells. The capture register stores data read out from a memory bit cell selected out of the plurality of memory bit cells. The writing unit writes relevant data according to the data stored in the capture register to the memory bit cell. The control unit reads the relevant data from the written memory bit cell, compares the relevant data according to the data stored in the capture register and the read-out relevant data, controls the capture register such that a comparison result is stored by overwriting a result as a self-test result about the written memory bit cell, and controls the writing unit such that the original data according to the read-out relevant data is rewritten to the selected memory bit cell.

20 Claims, 10 Drawing Sheets

SEMICONDUCTOR INTEGRATED CIRCUIT CAPABLE OF PERFORMING SELF-TEST

CROSS-REFERENCE TO RELATED APPLICATIONS

This application is based upon and claims the benefit of priority from Japanese Patent Application No. 2014-051714, filed on Mar. 14, 2014 which are incorporated herein by reference.

FIELD

Embodiments described herein relate generally to a semiconductor integrated circuit.

BACKGROUND

There is a method of detecting defects in a memory for ensuring quality of shipped products by embedding a built-in self-test (BIST) circuit to a semiconductor integrated circuit in which the memory is embedded, and performing a memory test using the self-test circuit before the semiconductor integrated circuit is shipped. However, since the memory deteriorates over time in some cases, it is desirable that the defect detection on the memory be performed even after the semiconductor integrated circuit is shipped.

DETAILED DESCRIPTION

In general, according to one embodiment, there is provided a semiconductor integrated circuit including a memory, a capture register, a writing unit, and a control unit. The memory includes a plurality of memory bit cells. The capture register stores data read out from a memory bit cell selected out of the plurality of memory bit cells. The writing unit writes relevant data according to the data stored in the capture register to the memory bit cell. The control unit reads the relevant data from the written memory bit cell, compares the relevant data according to the data stored in the capture register and the read-out relevant data, controls the capture register such that a comparison result is stored by overwriting a result as a self-test result about the written memory bit cell, and controls the writing unit such that the original data according to the read-out relevant data is rewritten to the selected memory bit cell.

Exemplary embodiments of a semiconductor integrated circuit will be explained below in detail with reference to the accompanying drawings. The present invention is not limited to the following embodiments.

First Embodiment

Figure 7:
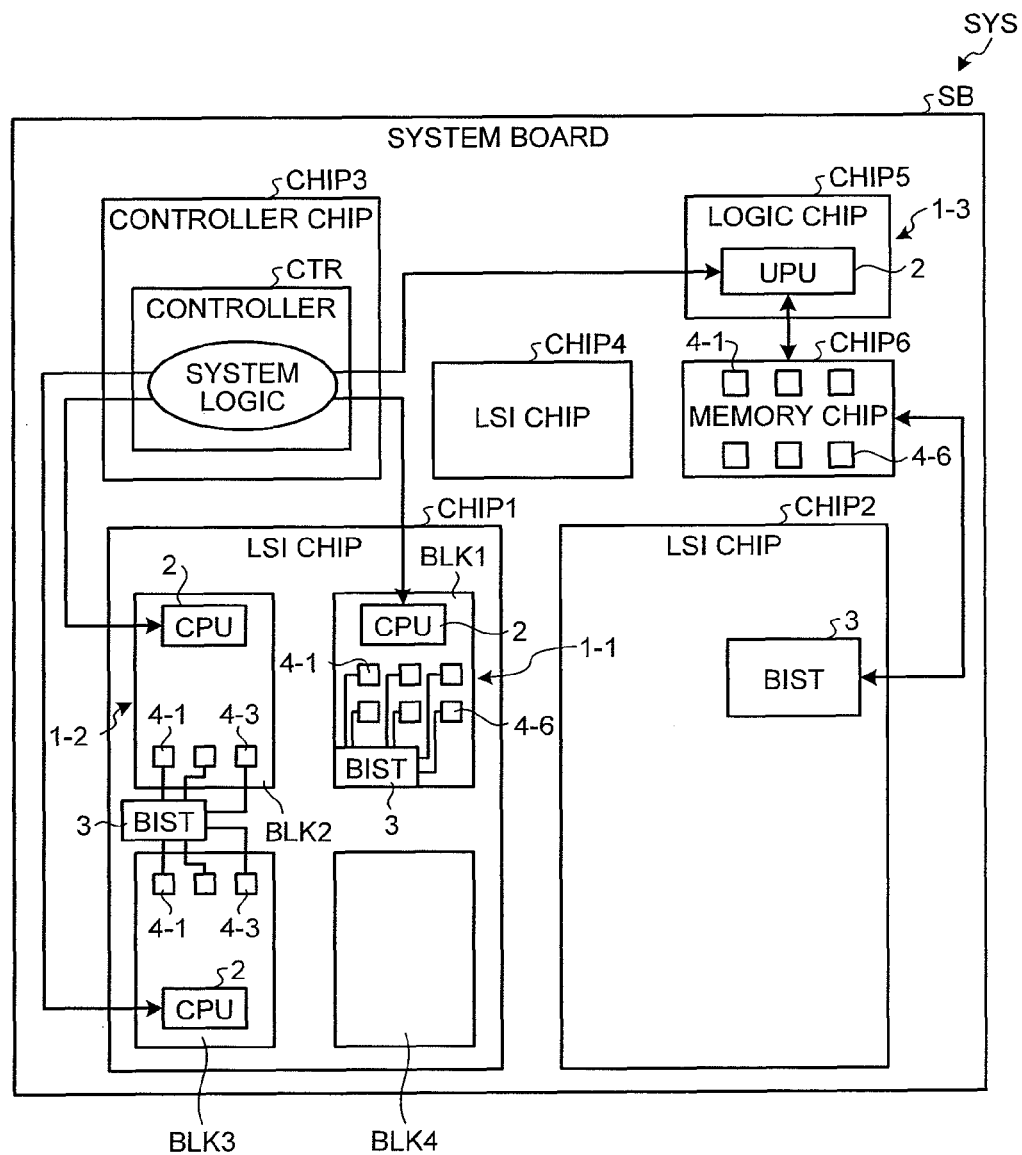
FIG. 7 is a diagram illustrating a configuration of a system to which a semiconductor integrated circuit according to a basic embodiment is applied.

Before starting the description about a semiconductor integrated circuit 100 according to a first embodiment, a semiconductor integrated circuit 1 according to a basic embodiment will be described using FIG. 7. FIG. 7 is a diagram illustrating a configuration of a system SYS to which the semiconductor integrated circuit 1 is applied.

The system SYS, for example, is built in as a system board SB as illustrated in FIG. 7. On the system board SB, a plurality of chips CHIP1 to CHIP6 are mounted. The chips CHIP1, CHIP2, and CHIP4 are LSI chips in which logic circuits and memories are embedded in a mixed manner. The chip CHIP3 is a controller chip on which a controller CTR is embedded to totally control the system SYS built with system logics. The chip CHIP5 is a logic chip in which a logic circuit is embedded. The chip CHIP6 is a memory chip in which a memory (volatile memory) is embedded.

The semiconductor integrated circuit 1, for example, is applied to the system SYS such as an automotive system for which high reliability is requested. In order to meet the high reliability requested for the system SYS, a memory (volatile memory) is embedded in the semiconductor integrated circuit 1, and also a built-in self-test (BIST) circuit is assembled thereto. In other words, before release of the semiconductor integrated circuit 1, a memory is tested using the self-test circuit to perform a defect detection on the memory. With this configuration, it is possible to efficiently perform a memory test compared to a case where a test pattern is supplied from the test apparatus for the memory test. Information of a defective memory bit cell (defective bit) obtained according to a result of the defect detection is stored in a fuse region of a nonvolatile memory circuit of the controller chip CHIP3 or the other chips CHIP1, CHIP2, and CHIP4 to CHIP6 as fail management information (fail bit map information). Therefore, the controller CTR refers to the fail management information according to a command for making access to the memory bit cell during the operation of the system SYS after release of the semiconductor integrated circuit 1. Then, the controller CTR controls the access to the memory bit cell while excluding the defective memory bit cell (defective bit) in the memory according to the fail management information.

For example, a semiconductor integrated circuit function 1-1 is built in a circuit block BLK1 among a plurality of circuit blocks BLK1 to BLK4 of the chip CHIP1. The semiconductor integrated circuit function 1-1 includes a CPU 2, a plurality of memory collars 4-1 to 4-6, and a self-test (BIST) circuit 3 in the circuit block BLK1. Each memory collar 4 includes a memory.

Alternatively, for example, a semiconductor integrated circuit function 1-2 is built in the circuit block BLK2 of the chip CHIP1 and between the circuit blocks BLK2 and BLK3. The semiconductor integrated circuit function 1-2 includes the CPU 2 and the plurality of memory collars 4-1 to 4-3 in the circuit block BLK2, and the self-test (BIST) circuit 3 which is disposed between the circuit blocks BLK2 and BLK3. Each memory collar 4 includes a memory.

Alternatively, for example, a semiconductor integrated circuit function 1-3 is built in over a range of the plurality of chips CHIP2, CHIP5, and CHIP6. The semiconductor integrated circuit function 1-3 includes the CPU 2 in the chip CHIP5, the plurality of memory collars 4-1 to 4-6 in the chip CHIP6, and the self-test (BIST) circuit 3 in the chip CHIP2. Each memory collar 4 includes a memory.

Figure 8:
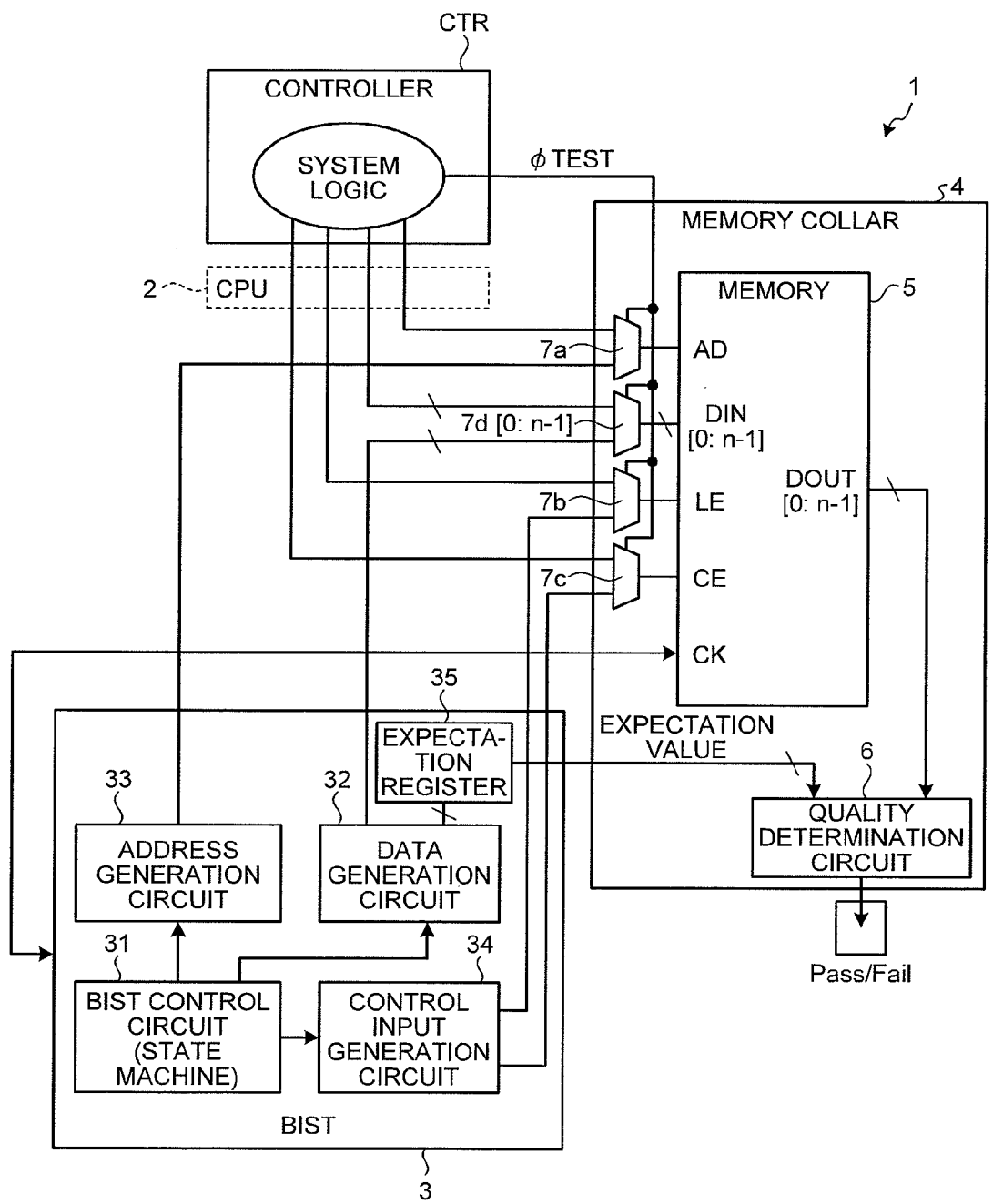
FIG. 8 is a diagram illustrating a configuration of the semiconductor integrated circuit according to the basic embodiment.

Herein, since the memory deteriorates over time in some cases, it is desirable that the memory be subjected to a defect detection even after release of the semiconductor integrated circuit 1. For example, the semiconductor integrated circuit 1 is configured as illustrated in FIG. 8 in order to perform the defect detection on the memory even after release of the semiconductor integrated circuit 1. FIG. 8 is a diagram illustrating a configuration of the semiconductor integrated circuit 1.

The semiconductor integrated circuit 1 includes the CPU 2, the self-test (BIST) circuit 3, and a plurality of memory collars 4. In addition, the semiconductor integrated circuit 1 includes the plurality of memory collars 4 (see FIG. 7), but the self-test (BIST) circuit 3 and one memory collar 4 are illustrated in FIG. 8 for example.

The CPU 2 receives a predetermined command/data from the controller CTR, generates a control signal/data according to the predetermined command/data, and supplies the control signal/data to the memory collar 4.

Each memory collar 4 includes a memory 5, selectors 7a to 7d, and a defect detection circuit 6. The memory 5 includes a plurality of memory bit cells, and can have access to a memory bit cell selected by an address signal from among the plurality of memory bit cells to store data. The memory 5 receives the address signal to an address terminal AD through the selector 7a, data D[0:n−1] to data input terminals DIN[0:n−1] through the selectors 7d[0:n−1], a chip enable signal to a chip enable terminal CE through the selector 7c, and a clock signal to a clock terminal CK. The data D[0:n−1] is output from data output terminals DOUT[0:n−1] of the memory 5. In other words, each memory collar 4 is configured to perform tests on n (n is an integer of 2 or more) memory bit cells in parallel.

It should be noted that the data input terminal DIN, the selector 7d, and the data output terminal DOUT each are provided as many as n corresponding to n bits of a data width of the input data D[0:n−1].

Figure 9:
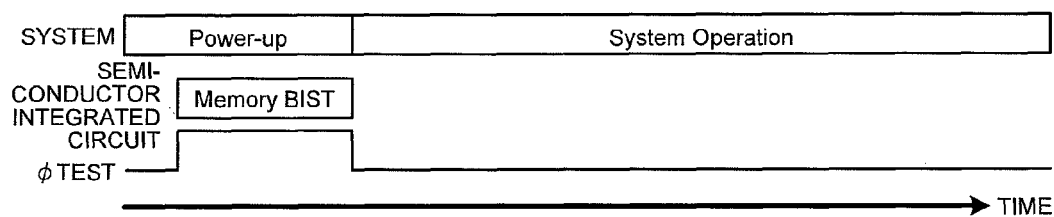
FIG. 9 is a sequence diagram illustrating operations of a system and the semiconductor integrated circuit in the basic embodiment.

As illustrated in FIG. 9, the controller CTR sets a test mode signal φTEST to be at an active level in a predetermined period at the time when the system SYS is powered up, and keeps the test mode signal φTEST at a non-active level during a system operation of the system SYS according to system logics. FIG. 9 is a sequence diagram illustrating operations of the system SYS and the semiconductor integrated circuit 1.

According to the above operations, the respective selectors 7a to 7d illustrated in FIG. 8 select the inputs from the self-test circuit 3 when the test mode signal φTEST supplied from the controller CTR is at the active level. When the test mode signal φTEST is at the non-active level, the inputs from the CPU 2 are selected. In other words, the respective selectors 7a to 7d select the inputs from the self-test circuit 3 and output the inputs to the memory 5 in a predetermined period at the time when the system SYS is powered up, so that a test operation (Memory BIST) of the memory 5 is performed. During the system operation of the system SYS, the respective selectors 7a to 7d select the inputs from the CPU 2 and output the inputs to the memory 5, so that an access operation to the memory 5 is performed under control from the system SYS.

The defect detection circuit 6 illustrated in FIG. 8 includes logical elements necessary for the test operation of the memory 5. The defect detection circuit 6 outputs defect detection information (fail flag) indicating "Pass" or "Fail" as a result of the defect detection. The defect detection information thus output is reflected on the fail management information (fail bit map information) by the controller CTR or the like and stored in the fuse region of the nonvolatile memory circuit.

The self-test (BIST) circuit 3 includes a BIST control circuit 31, a data generation circuit 32, an address generation circuit 33, a control input generation circuit 34, and an expectation register 35. The BIST control circuit 31 is a state machine which makes the overall control of the self-test circuit 3. The data generation circuit 32 generates test data patterns Dt[0:n−1] to be given to the data input terminals DIN of the memory 5. The address generation circuit 33 generates an address of a memory bit cell in the memory 5 to which the test data patterns Dt[0:n−1] are given. The control input generation circuit 34 generates control signals for controlling the reading and writing of the memory 5 in the test operation. When the data generation circuit 32 supplies the test data patterns Dt[0:n−1] to the memory 5, the expectation register 35 receives the test data patterns Dt[0:n−1] from the data generation circuit 32 and stores the test data patterns. The expectation register 35 supplies the stored test data patterns Dt[0:n−1] as expectation values De[0:n−1] to the defect detection circuit 6. In other words, the same data patterns as the test data patterns Dt[0:n−1] supplied from the data generation circuit 32 to the memory 5 are supplied as the expectation values De[0:n−1] showing correct data patterns in the test operation by the expectation register 35 to the defect detection circuit 6.

Figure 10:
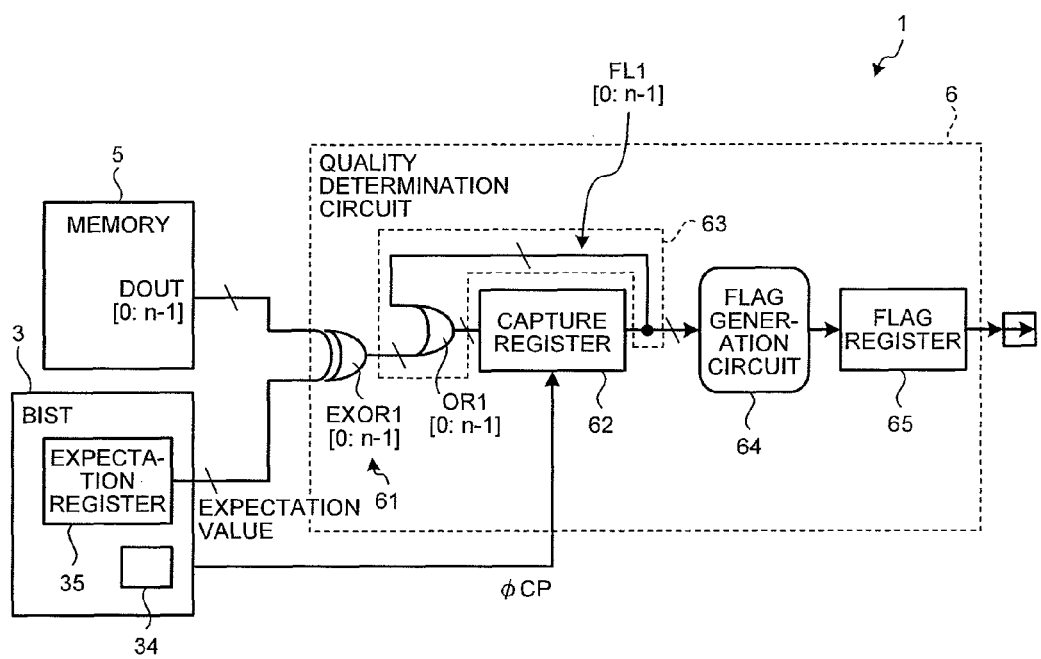
FIG. 10 is a diagram illustrating a configuration of the semiconductor integrated circuit according to the basic embodiment.
Figure 11:
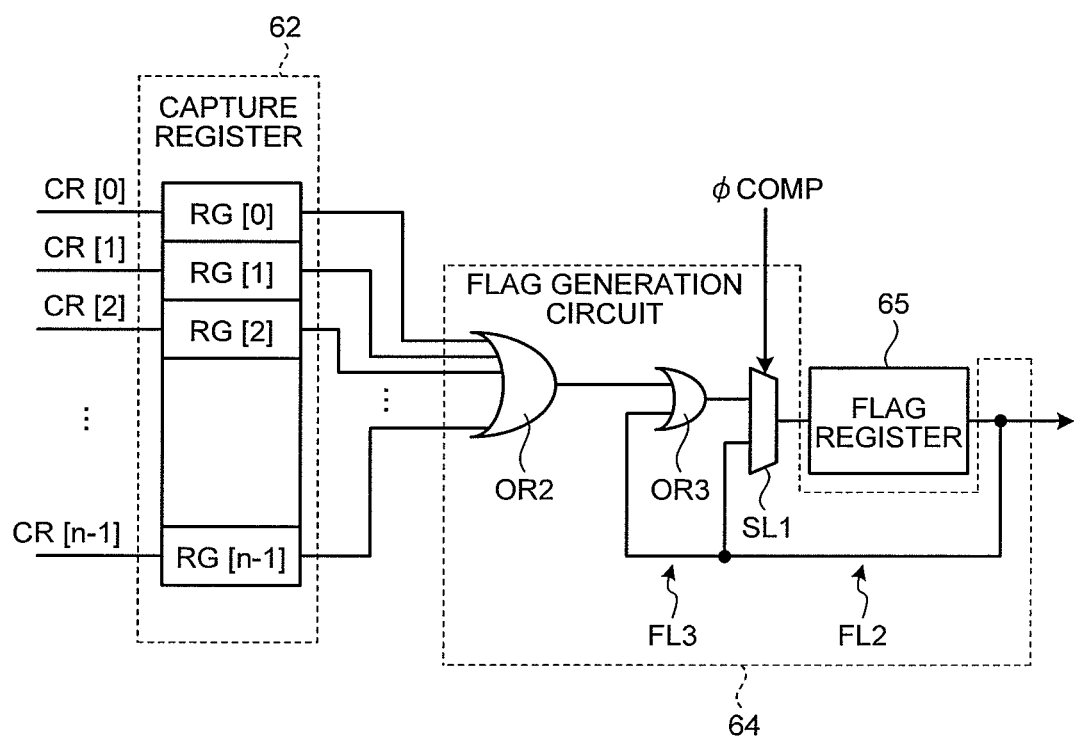
FIG. 11 is a diagram illustrating a configuration of a capture register, a flag generation circuit, and a flag register in the basic embodiment.

Next, an internal configuration of the defect detection circuit 6 will be described using FIGS. 10 and 11. FIG. 10 is a diagram illustrating an internal configuration of the defect detection circuit 6 in the semiconductor integrated circuit 1. FIG. 11 is a diagram illustrating configurations of a capture register 62, a flag generation circuit 64, and a flag register 65.

The defect detection circuit 6 in each memory collar 4 (see FIG. 8) includes a comparator 61, the capture register 62, an accumulator 63, the flag generation circuit 64, and the flag register 65.

In a period of time when the test mode signal NEST is at the active level, the self-test circuit 3 sets the chip enable signal and a latch enable signal to be at the active level. The self-test circuit 3 writes the test data patterns Dt[0:n−1] to n memory bit cells selected by the address signal in the memory 5 through the data input terminals DIN[0:n−1].

The comparator 61 receives data Dr[0:n−1] read out from the n-bit memory output selected by the address signal in the memory 5 through the data output terminals DOUT[0:n−1]. The comparator 61 receives the expectation values De[0:n−1] from the expectation register 35. The comparator 61 compares the read-out data Dr[0:n−1] and the expectation values De[0:n−1], and outputs comparison results CR[0:n−1] to the capture register 62.

The comparator 61 includes n exclusive disjunction operators EXOR1[0:n−1] as illustrated in FIG. 10. In a case where the read-out data Dr and the expectation value De are matched to each other, each exclusive disjunction operator EXOR1 outputs a bit value "0" indicating "Pass" as the comparison result CR. In a case where the read-out data Dr and the expectation value De are not matched to each other, each exclusive disjunction operator EXOR1 outputs a bit value "1" indicating "Fail" as the comparison result CR.

The capture register 62 stores the comparison results CR[0:n−1] of the comparator 61 according to a capture timing signal ϕCP. The control input generation circuit 34 sets the capture timing signal ϕCP to be at the active level at timing when the comparison results CR[0:n−1] are are stored by the capture register 62, and supplies the comparison results to the capture register 62. The capture register 62 stores the comparison results CR[0:n−1] of the comparator 61 in a period when the capture timing signal ϕCP is at the active level. For example, the capture register 62 includes n registers RG[0:n−1] as illustrated in FIG. 11, and stores bits corresponding to the comparison results CR[0:n−1].

The accumulator 63 illustrated in FIG. 10 accumulates defective detection information (the bit value "1" indicating "Fail") in the capture register 62. In other words, in a period when the test mode signal ϕTEST is at the active level, the self-test circuit 3 performs a series of cyclic test operations "Writing n memory bit cells with the test data pattern Dt→Reading out→ Comparing with the expectation value" in an initial addressing state of the address signal. Then, the self-test circuit 3 repeatedly performs the cyclic test operations "Writing n memory bit cells with the test data pattern Dt→Reading out→Comparing with the expectation value" while counting up or down the address signal until the final address is reached. At this time, in a case where the bit value "1" indicating "Fail" is found out even just once among the n bits, the bit value is handed down even in the subsequent steps of the cyclic test operation and thus the bit value "1" is maintained.

The accumulator 63 includes n logical sum operators OR1[0:n−1] and feedback lines FL1[0:n−1] having an n-bit width. The feedback lines FL1[0:n−1] feed the outputs of the registers RG[0:n−1] back to the inputs of the logical sum operators OR1[0:n−1]. The logical sum operators OR1[0:n−1] calculate a logical sum of the fed-back outputs of the fed-back registers RG[0:n−1] and the outputs of the exclusive disjunction operators EXOR1[0:n−1], and inputs the calculation results to the registers RG[0:n−1]. Therefore, the accumulator 63 accumulates the bit value "1" indicating "Fail" for each of the n registers RG[0:n−1].

When the test operation from the initial address to the final address is ended, the flag generation circuit 64 generates the defect detection information (fail flag) indicating "Pass" or "Fail" as a result of the defect detection based on the comparison results CR[0:n−1] stored in the capture register 62. The fail flag is a 1-bit flag of which the bit value "0" represents "Pass" and the bit value "1" represents "Fail".

As illustrated in FIG. 11, the flag generation circuit 64 includes logical sum operators OR2 and OR3, a selector SL1, and feedback lines FL2 and FL3. The logical sum operator OR2 calculates a logical sum of the outputs of the n registers RG[0:n−1], and outputs the calculation results to the logical sum operator OR3. The feedback line FL3 feeds the output of the flag register 65 back to an input of the logical sum operator OR3. The logical sum operator OR3 calculates a logical sum of the output of the logical sum operator OR2 and the fed-back output of the flag register 65, and outputs the calculation results to the selector SL1.

The feedback line FL2 feeds the output of the flag register 65 back to an input of the selector SL1. The selector SL1 selects the output of the logical sum operator OR3 and the fed-back output of the flag register 65 according to a completion signal ϕCOMP indicating the end of the test operation. In other words, the selector SL1 selects the output of the flag register 65 and supplies the output to the flag register 65 when the completion signal ϕCOMP is at the non-active level (the test operation is not completed). Therefore, the flag register 65 is configured to accumulate the previous defect detection information (the value "1" of the fail flag indicating "Fail"). When the completion signal ϕCOMP is at the active level (the test operation is completed), the selector SL1 selects the output of the logical sum operator OR3 and supplies the output to the flag register 65. Therefore, the flag register 65 is configured to store the defect detection information (fail flag) determined according to the result of the current test operation.

In this way, since the test data pattern Dt is written in each memory bit cell of the memory 5 in the defect detection on the memory 5 by the self-test circuit 3, the defect detection can be performed at the time when the system SYS is powered up. However, the defect detection may cause some trouble when it is performed during the system operation of the system SYS. During the system operation of the system SYS, there is a possibility that each memory bit cell of the memory 5 is already written with data. Therefore, when the test data pattern Dt is written in each memory bit cell by performing the test operation, there is a concern that the already-written data is rewritten and lost.

However, in a case where a system operation time of the system SYS is lengthened after the system SYS is powered up, there is a possibility that a fail not found out at the power-up appears due to variation in voltage or temperature. Therefore, it is desirable that the defect detection on the memory 5 be performed even during the system operation of the system SYS.

Therefore, in the first embodiment, the semiconductor integrated circuit 100, in a period when there is no access to the memory 5 during the system operation of the system SYS, performs the test operation using relevant data according to the data already written in each memory bit cell, and then rewrites to the original memory bit cell the original data according to the relevant data. Therefore, the test operation is performed on some of addresses in a short time during the system operation of the system SYS and is ended in a state where the data is not rewritten, so that an in-system self-test (ISST) can be performed during the system operation. In the following, the description will be made focusing on a portion different from the basic embodiment.

Figure 1:
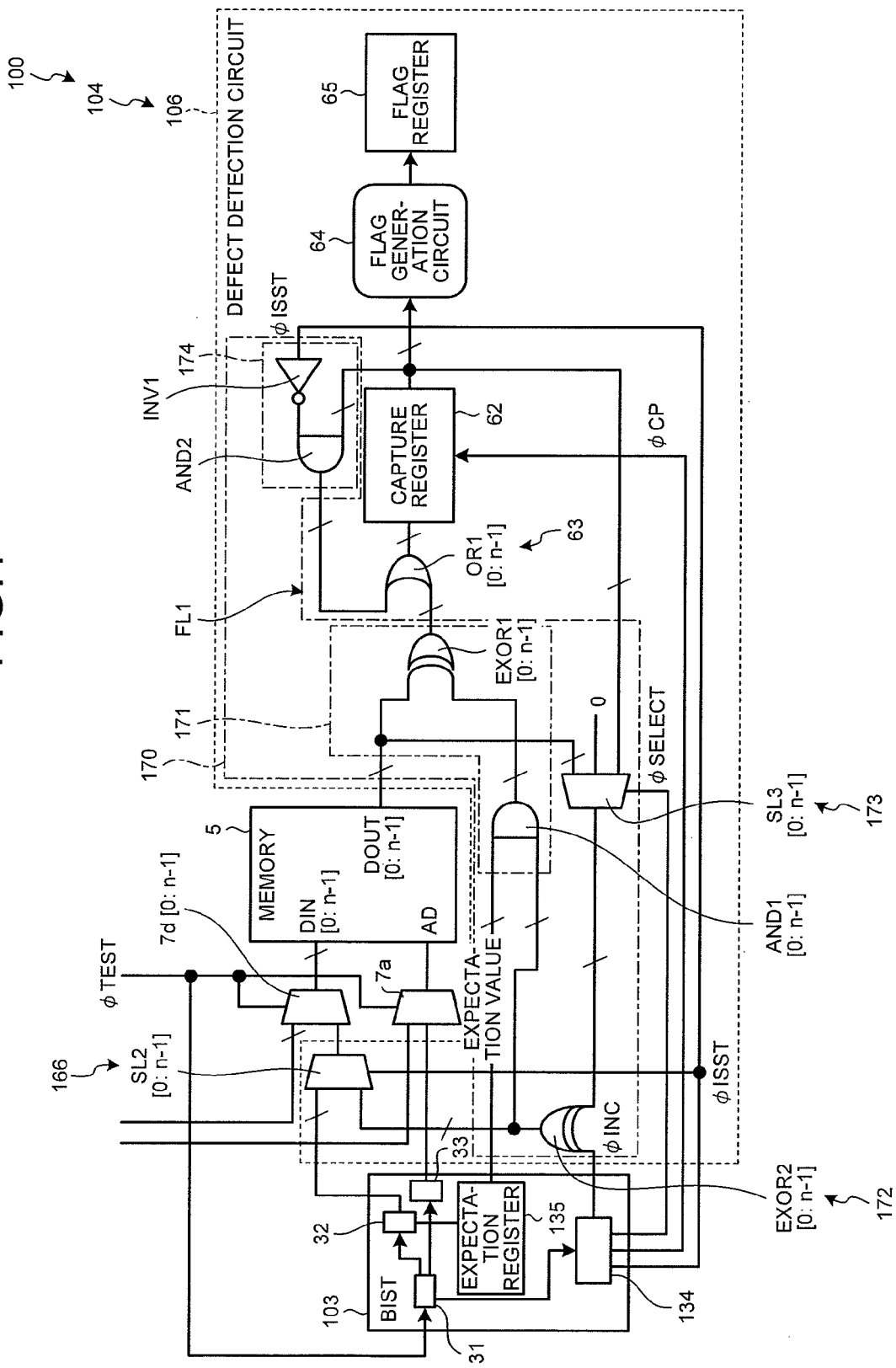
FIG. 1 is a diagram illustrating a configuration of a semiconductor integrated circuit according to a first embodiment.

Specifically, the semiconductor integrated circuit 100 includes a self-test (BIST) circuit 103 and a plurality of memory collars 104 instead of the self-test (BIST) circuit 3 and the plurality of memory collars 4 (see FIG. 8). In addition, the semiconductor integrated circuit 100 includes the plurality of memory collars 104, but the self-test circuit 103 and one memory collar 104 are illustrated in FIG. 1 for example.

Each memory collar 104 includes a defect detection circuit 106 instead of the defect detection circuit 6 (see FIG. 10). The defect detection circuit 106 includes a control unit 170 instead of the comparator 61 (see FIG. 10), and further includes a writing unit 166. The control unit 170 includes a switching unit (a second switching unit) 174, a switching unit (a first switching unit) 173, a generation unit 172, and a comparator 171.

In a period when the test operation is to be performed in the system operation of the system SYS, the writing unit 166 writes the relevant data according to the data stored in the capture register 62 to the memory bit cell selected by the address signal of the memory 5. For example, the writing unit 166 receives inverted data which is obtained by logically inverting the data stored in the capture register 62 from the control unit 170, and writes the inverted data to the selected memory bit cell.

For example, the writing unit 166 includes n selectors SL2[0:n−1]. Each of the n selectors SL2[0:n−1] selects any one of the output of the data generation circuit 32 and the output of the generation unit 172 according to an self-test mode signal φISST.

Figure 2:
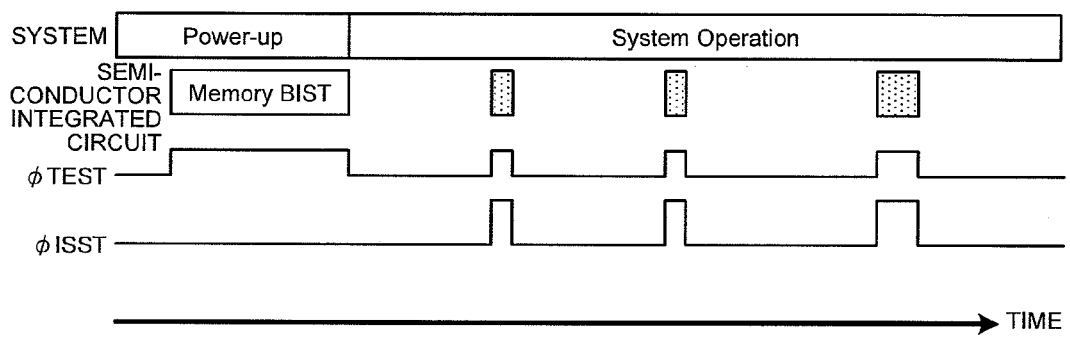
FIG. 2 is a sequence diagram illustrating operations of a system and the semiconductor integrated circuit in the first embodiment.

As illustrated in FIG. 2, the controller CTR (see FIG. 8) sets the test mode signal φTEST to be at the active level in a predetermined period of time when the system SYS is powered up according to the system logics.

Further, the controller CTR has knowledge of a period when each of the plurality of memory collars 104 has no access to the memory 5 according to the system logics. Examples of the period of no-access to the memory 5 include a period of access to another memory 5 during the system operation of the system SYS, a period immediately before the memory 5 transitions to a sleep mode, a period immediately after the memory 5 returns from the sleep mode, a period immediately before power to the circuit block of the memory 5 is turned off, and a period immediately after power to the circuit block of the memory 5 is turned on.

As illustrated in FIG. 2, the controller CTR sets the test mode signal φTEST to be at the active level in a period when there is no access to the memory 5 which is to be subjected to the test operation during the system operation of the system SYS. FIG. 2 is a sequence diagram illustrating operations of the system SYS and the semiconductor integrated circuit 100.

A control input generation circuit 134 in the self-test circuit 103 receives the test mode signal φTEST through the BIST control circuit 31 from the controller CTR. The control input generation circuit 134 generates the self-test mode signal φISST according to the test mode signal φTEST and supplies the self-test mode signal to the writing unit 166 and the switching unit 174. In other words, the control input generation circuit 134 keeps the self-test mode signal φISST at the non-active level when the system SYS is powered up, and makes the self-test mode signal φISST transition between the active level and the non-active level to follow the test mode signal φTEST when the system SYS is in operation (see FIG. 2).

In accordance with the above operation, when the test mode signal φTEST transitions to the active level when the system SYS is powered up and the self-test mode signal φISST is at the non-active level, each of the selectors SL2[0:n−1] selects the output of the data generation circuit 32 to supply the output through the selector 7d to the memory 5. Therefore, each of the selectors SL2[0:n−1] writes the test data patterns Dt[0:n−1] to the selected memory bit cell. When the self-test mode signal φISST transitions to the active level during the system operation of the system SYS, each of the selectors SL2[0:n−1] selects the output of the generation unit 172 to supply the output through the selector 7d to the memory 5. Therefore, each of the selectors SL2[0:n−1] writes the inverted data, which is obtained by logically inverting the data stored in the capture register 62 using the generation unit 172, to the selected memory bit cell.

The control unit 170 generates the relevant data according to the data stored in the capture register 62 and supplies the relevant data to the writing unit 166. For example, the control unit 170 logically inverts the data stored in the capture register 62 to generate the inverted data, and supplies the inverted data to the writing unit 166. Further, the control unit 170 reads the relevant data (the inverted data) from the selected memory bit cell. The control unit 170 compares the relevant data (the inverted data) according to the data stored in the capture register 62 and the read-out relevant data (the inverted data). The control unit 170 makes control on the capture register 62 such that the comparison result is overwritten and stored as a self-test result of the selected memory bit cell. The control unit 170 makes control on the writing unit 166 such that the original data according to the read-out relevant data (the inverted data) is rewritten to the selected memory bit cell.

Specifically, the switching unit 174 switches the operation of the capture register 62 between a first mode and a second mode according to the self-test mode signal φISST. The first mode is an operation mode in which the comparison result received from the comparator 171 is accumulated and stored in the capture register 62. The second mode is an operation mode in which the comparison result received from the comparator 171 is stored in the capture register 62 without accumulating the result. The switching unit 174 switches the operation to the first mode when the self-test mode signal φISST is at the non-active level, and to the second mode when the self-test mode signal φISST is at the active level.

For example, the switching unit 174 includes a logical inversion operator INV1 and a logical multiplication operator AND2. The logical inversion operator INV1 makes the self-test mode signal φISST logically inverted to generate the signal ⁻φISST, and supplies the signal to the logical multiplication operator AND2. The logical multiplication operator AND2 calculates a logical multiplication operation between the signal ⁻φISST and the output of the capture register 62, and supplies the calculation results to the logical sum operator OR1. Therefore, when the self-test mode signal φISST is at the non-active level, the feedback line FL1 becomes active and the output of the capture register 62 is fed back to the input of the logical sum operator OR1, so that the operation can be switched to the first mode. Further, when the self-test mode signal φISST is at the active level, the feedback line FL1 becomes nonactive and the output of the capture register 62 is not fed back to the input of the logical sum operator OR1, so that the operation can be switched to the second mode.

When the system SYS is powered up, the control input generation circuit 134 supplies the test data patterns Dt[0:n−1] to the selected memory bit cell, and supplies the self-test mode signal φISST at the non-active level to the switching unit 174 in order to make the switching unit 174 switched to the first mode. Therefore, similar test operation to that of the basic embodiment is performed in the defect detection circuit 106.

The control input generation circuit 134 does not supply the test data to the selected memory bit cell, during the system operation of the system SYS, and supplies the self-test mode signal φISST at the active level to the switching unit 174 in order to make the switching unit 174 switched to the second mode. Therefore, the defect detection circuit 106 can perform the ISST during the system operation of the system.

The switching unit 173 is switched between a first state and a second state according to a select signal (a first select signal) φSELECT. The first state is a state in which the data stored in the capture register 62 is supplied to the generation unit 172. The second state is a state in which the inverted data read out from the selected memory bit cell is supplied to the generation unit 172. When the select signal φSELECT is at a first level, the switching unit 173 is switched to the first state, and when the select signal φSELECT is at a second level, switched to the second state.

For example, the switching unit 173 includes a selector SL3. The selector SL3 selects any one of the data output terminals DOUT[0:n−1] of the memory 5, the output of the capture register 62, and a fixed bit value "0" according to the select signal φSELECT. When the select signal φSELECT is at the first level, the selector SL3 selects the output of the capture register 62 and supplies the data to the generation unit 172, so that the operation can be switched to the first state. When the select signal φSELECT is at the second level, the selector SL3 selects the data output terminals DOUT[0:n−1] of the memory 5 and supplies the data to the generation unit 172, so that the operation can be switched to the second state. When the select signal φSELECT is at a third level, the selector SL3 selects the fixed bit value "0" and supplies the value to the generation unit 172.

In a period when the self-test mode signal φISST is at the active level, the control input generation circuit 134 supplies the select signal φSELECT at the first level to the switching unit 173 in order to make the switching unit 173 switched to the first state until the comparison result of the comparator 171 is completely output to the capture register 62. Therefore, the data stored in the capture register 62 can be supplied to the generation unit 172.

In a period when the self-test mode signal φISST is at the active level, the control input generation circuit 134 supplies the select signal φSELECT at the second level to the switching unit 173 in order to make the switching unit 173 switched to the second state after the comparison result of the comparator 171 is completely output to the capture register 62. Therefore, the inverted data read out from the selected memory bit cell can be supplied to the generation unit 172.

The generation unit 172 makes the output of the switching unit 173 logically inverted according to an invert control signal φINC of the active level. For example, when the switching unit 173 is switched to the first state, the generation unit 172 makes the data stored in the capture register 62 logically inverted to generate the inverted data and supplies the data to the writing unit 166. Accordingly, the writing unit 166 writes the inverted data to the selected memory bit cell. When the switching unit 173 is switched to the second state, the generation unit 172 makes the inverted data read out from the selected memory bit cell logically inverted to recover the original data, and supplies the recovered original data to the writing unit 166. Accordingly, the writing unit 166 rewrites the original data to the selected memory bit cell.

For example, the generation unit 172 includes n exclusive disjunction operators EXOR2[0:n−1]. Each exclusive disjunction operator EXOR2 calculates an exclusive disjunction operation between the invert control signal φINC (=bit value "1") at the active level and the output of the selector SL3. In a case where the output of the selector SL3 is the bit value "1", a bit value "0" is output, and in a case where the output of the selector SL3 is the bit value "0", the bit value "1" is output. Therefore, each exclusive disjunction operator EXOR2 can make the output of the selector SL3 logically inverted.

The comparator 171 compares the inverted data read out from the selected memory bit cell and the inverted data generated by the generation unit 172. The comparator 171 outputs the comparison result as a self-test result about the selected memory bit cell to the capture register 62. In a period when the capture timing signal φCP is at the active level, the capture register 62 stores the comparison result.

For example, the comparator 171 includes n logical multiplication operators AND1[0:n−1] in addition to the n exclusive disjunction operators EXOR1[0:n−1]. Each logical multiplication operator AND1 calculates a logical multiplication operation between the output of an expectation register 135 and the output of the exclusive disjunction operator EXOR2, and supplies the calculation results to the exclusive disjunction operator EXOR1.

When the system SYS is powered up, the expectation register 135 outputs the same expectation values De[0:n−1] as the test data patterns Dt[0:n−1], and the control input generation circuit 134 supplies the select signal φSELECT at the third level to the selector SL3. Therefore, the output of the exclusive disjunction operator EXOR2 becomes a fixed bit value "1", and the same expectation values De[0:n−1] are output to the exclusive disjunction operator EXOR1, so that the defect detection circuit 106 performs the test operation similar to that of the basic embodiment.

During the system operation of the system SYS, the expectation register 135 outputs the expectation values De[0:n−1] of which the bits each are set to the fixed bit value "0". Therefore, the data read out from the selected memory bit cell can be stored in the capture register 62 without any change. In a period when the capture timing signal φCP is at the active level, the capture register 62 stores the data read out from the selected memory bit cell. Then, the expectation register 135 outputs the expectation values De[0:n−1] of which the bits each are set to the fixed bit value "1". Therefore, the inverted data obtained by logically inverting the data stored in the capture register 62 using the generation unit 172 is supplied to the exclusive disjunction operator EXOR1, so that in a case where the inverted data read out from the selected memory bit cell and the inverted data generated by the generation unit 172 are matched with each other, the exclusive disjunction operator EXOR1 outputs the bit value "0" indicating "Pass" as the comparison result CR. In a case where the inverted data read out from the selected memory bit cell and the inverted data generated by the generation unit 172 are not matched with each other, each exclusive disjunction operator EXOR1 outputs the bit value "1" indicating "Fail" as the comparison result CR. In other words, the defect detection circuit 106 can perform the ISST during the system operation of the system.

Figure 3:
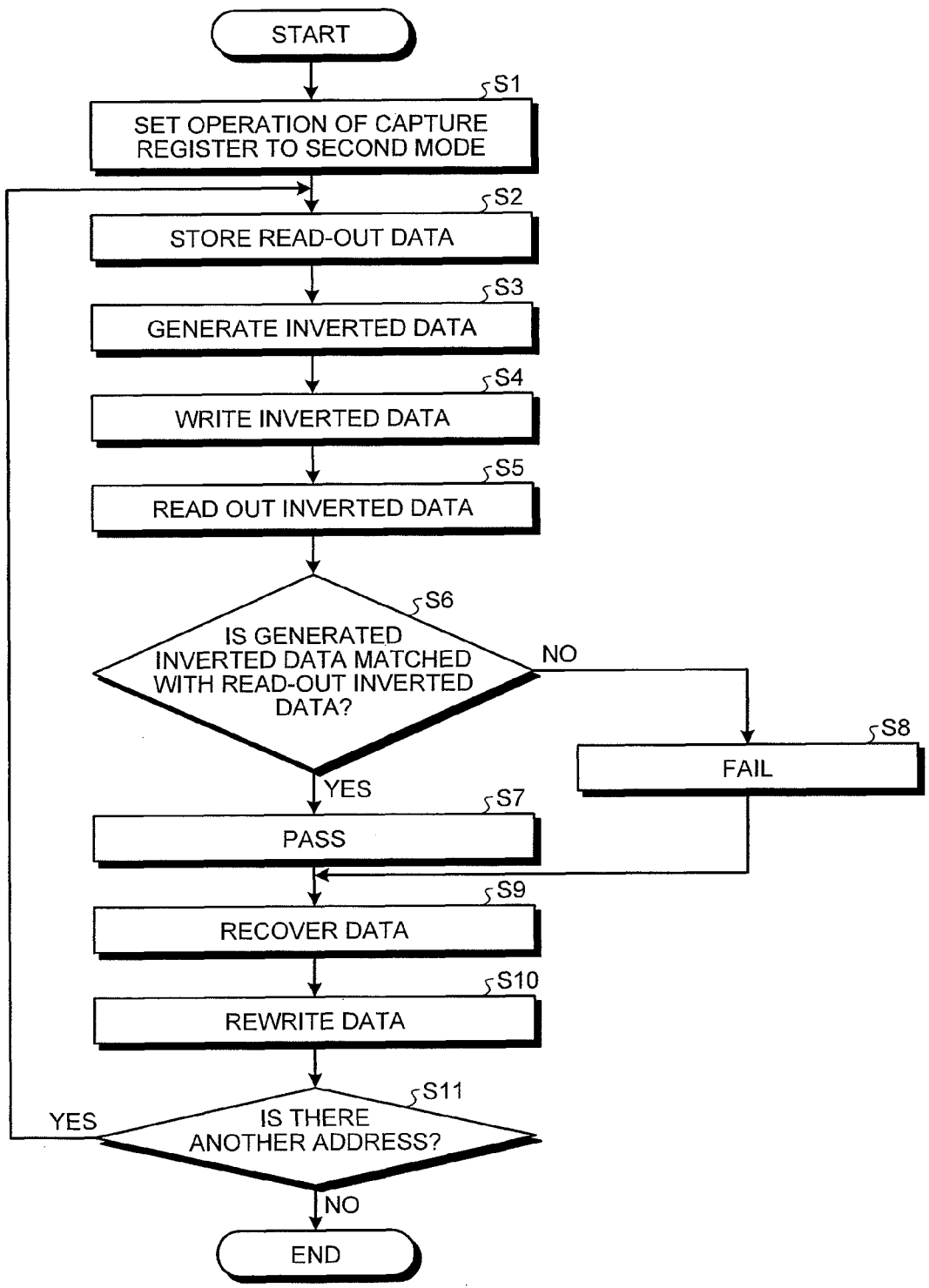
FIG. 3 is a flowchart illustrating an operation of the semiconductor integrated circuit according to the first embodiment.

Next, the operation of the semiconductor integrated circuit 100 will be described using FIG. 3. FIG. 3 is a flowchart illustrating an operation of the semiconductor integrated circuit 100.

The self-test (BIST) circuit 103 sets the self-test mode signal φISST to be at the active level and supplies the signal to the switching unit 174, and sets the operation mode of the capture register 62 to the second mode (S1).

The self-test circuit 103 increases a BIST address counter in the address generation circuit 33 by 1, and designates an address AD1 where the ISST is performed during the system operation. The comparator 171 reads the data D1 from the memory bit cell selected at the address AD1, and the self-test circuit 103 sets all the bit values of the expectation values De[0:n−1] to "0". Therefore, the comparator 171 stores the data D1 read out from the memory bit cell in the capture register 62 without any change (S2). In a period when the capture timing signal φCP is at the active level, the capture register 62 stores the data D1.

The self-test (BIST) circuit 103 sets the select signal φSELECT to be at the first level and supplies the signal to the switching unit 173, and makes the switching unit 173 switched to the first state. The self-test (BIST) circuit 103 sets the invert control signal φINC to be at the active level. Accordingly, the generation unit 172 makes the data D1 stored in the capture register 62 logically inverted to generate the inverted data ⁻D1, and supplies the data to the writing unit 166 (S3). Accordingly, the writing unit 166 writes the inverted data ⁻D1 to the selected memory bit cell (S4).

The comparator 171 reads the inverted data ⁻D1 from the memory bit cell selected at the address AD1 (S5), the self-test circuit 103 sets all the bits of the expectation values De[0:n−1] to "1". Therefore, the comparator 171 determines whether the inverted data ⁻D1 generated by the generation unit 172 and the inverted data ⁻D1 read out from the selected memory bit cell are matched with each other (S6). In a case where the inverted data ⁻D1 generated by the generation unit 172 and the inverted data ⁻D1 read out from the selected memory bit cell are matched with each other (Yes in S6), the comparator 171 outputs the bit value "0" indicating "Pass" as the comparison result CR to the capture register 62 to be stored therein (S7). The capture register 62 stores the comparison result CR in a period when the capture timing signal φCP is at the active level. In a case where the inverted data ⁻D1 generated by the generation unit 172 and the inverted data ⁻D1 read out from the selected memory bit cell are not matched with each other (No in S6), the comparator 171 outputs the bit value "1" indicating "Fail" as the comparison result CR to the capture register 62 to be stored therein (S8). The capture register 62 stores the comparison result CR in a period when the capture timing signal φCP is at the active level.

The self-test (BIST) circuit 103 sets the select signal φSELECT to be at the second level and supplies the signal to the switching unit 173, and makes the switching unit 173 switched to the second state. The generation unit 172 makes the inverted data ⁻D1 read out from the selected memory bit cell logically inverted to restore the original data D1, and supplies the original data to the writing unit 166 (S9). Accordingly, the writing unit 166 rewrites the original data D1 to the selected memory bit cell (S10).

The self-test circuit 103 determines whether there is a surplus of time for performing the ISST on another address during the system operation (S11). For example, when the timing of the transition of the test mode signal φTEST from the active level to the non-active level is informed from the controller CTR in advance and a time left until the timing comes is equal to or longer than a time taken for the test operation of a series of cycles S2 to S10, the self-test circuit 103 can determine that there is also a surplus of time for performing the test on another address. In a case where there is a surplus of time for performing the test on another address (Yes in S11), the self-test circuit 103 returns the process to S2, and in a case where there is no surplus of time for another address (No in S11), the process is ended.

As described above, in the first embodiment, in the semiconductor integrated circuit 100, the capture register 62 stores the data read out from the selected memory bit cell. The writing unit 166 writes the relevant data according to the data stored in the capture register 62 to the selected memory bit cell. For example, the writing unit 166 writes the inverted data, which is obtained by logically inverting the data stored in the capture register 62, to the selected memory bit cell. The control unit 170 reads the relevant data (the inverted data) from the selected memory bit cell, and compares the relevant data (the inverted data) according to the data stored in the capture register 62 and the relevant data (the inverted data) read out from the selected memory bit cell. The control unit 170 makes control on the capture register 62 such that the comparison result is overwritten and stored as the self-test result about the selected memory bit cell. Then, the control unit 170 makes control on the writing unit 166 such that the original data according to the relevant data (the inverted data) read out from the selected memory bit cell is recovered and rewritten to the selected memory bit cell. Therefore, it is possible to perform the test on part of addresses in a short time during the system operation of the system SYS, and the test can be ended in a state where the data is not rewritten. As a result, the ISST during the system operation can be performed without losing data already written in the memory 5.

It should be noted that the first embodiment has been made for the case where the self-test circuit 103 increases the BIST address counter in the address generation circuit 33 by 1 to designate the address AD1 at which the ISST is to be performed during the system operation, but another method may be used to designate the address AD1 at which the ISST is to be performed. For example, a pseudorandom number generator is provided in the address generation circuit 33, and the address AD1 may be designated according to a random number generated by the pseudorandom number generator.

Further, when the system SYS performs a shutdown process, the test may be kept on such that the system SYS stores the current test address in the nonvolatile memory circuit, and after the system SYS is powered up at the next time, the address value is read out from the nonvolatile memory circuit as the initial value.

Second Embodiment

Next, a semiconductor integrated circuit 200 according to a second embodiment will be described. In the following, the description will be made focusing on portions different from the first embodiment.

Figure 4:
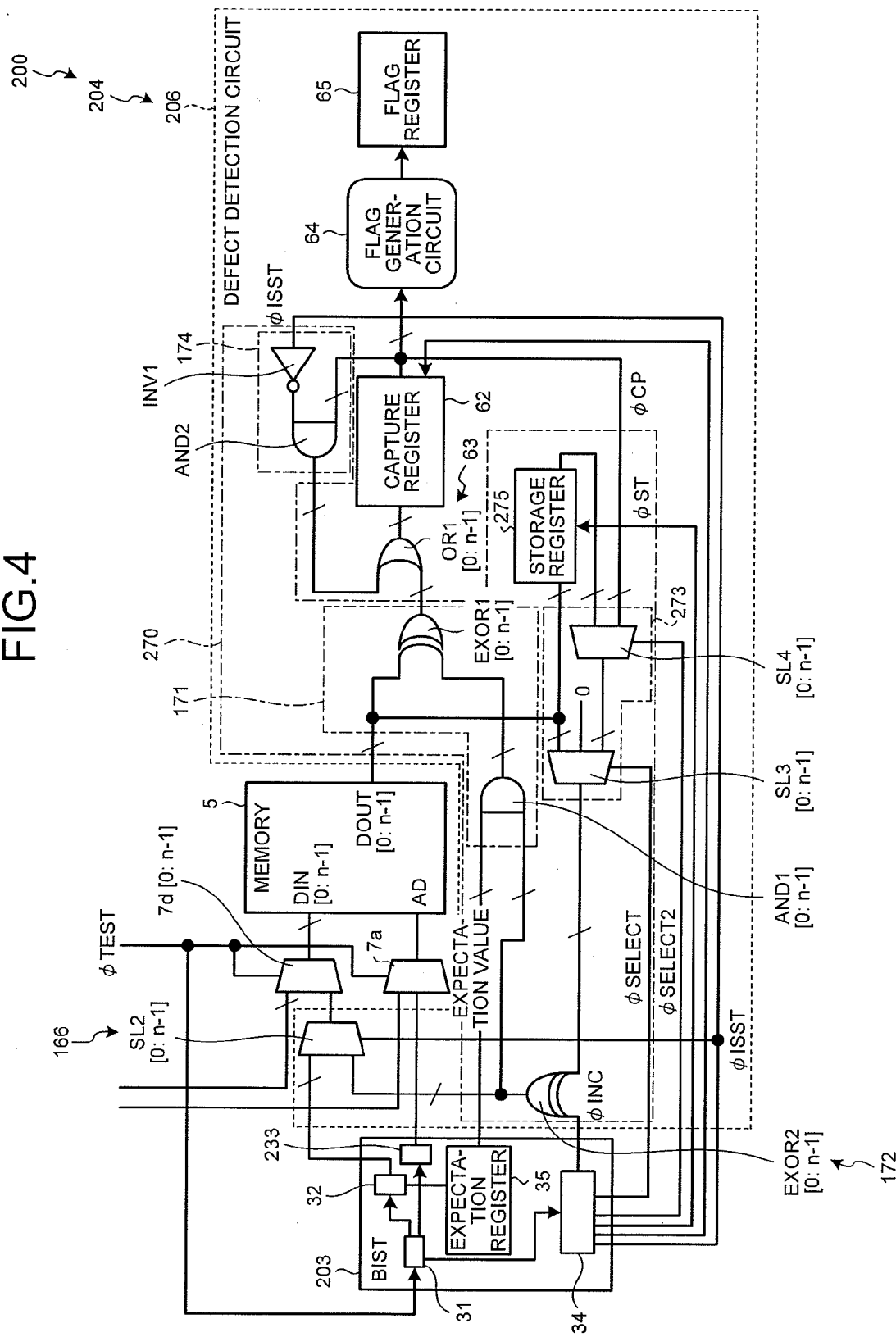
FIG. 4 is a diagram illustrating a configuration of a semiconductor integrated circuit according to a second embodiment.

In a defect detection circuit 206 of the semiconductor integrated circuit 200 according to the second embodiment, as illustrated in FIG. 4, a storage register 275 is provided in addition to the capture register 62 such that the writing on a plurality of addresses in the memory 5 can be sequentially performed using the data stored in each register.

Specifically, the semiconductor integrated circuit 200 includes a self-test (BIST) circuit 203 and a plurality of memory collars 204 instead of the self-test circuit 103 and the plurality of memory collars 104 (see FIG. 1). In addition, the semiconductor integrated circuit 200 includes the plurality of memory collars 204, but the self-test (BIST) circuit 203 and one memory collar 204 are illustrated in FIG. 4 for example.

An address generation circuit 233 of the self-test circuit 203 can sequentially generate a plurality of address signals AD11 and AD12. For example, the address generation circuit 233 may use the count value of the BIST address counter and an increased count value thereof as the address signals AD11 and AD12. Alternatively, for example, the address generation circuit 233 may include a plurality of BIST address counters, and cause the plurality of BIST address counters to generate a plurality of address signals AD11 and AD12 in parallel. At this time, the address generation circuit 233 can cause the plurality of BIST address counters to generate consecutive count values as the address signals AD11 and AD12.

Each memory collar 204 includes the defect detection circuit 206 instead of the defect detection circuit 106 (see FIG. 1). The defect detection circuit 206 includes a control unit 270 instead of the control unit 170 (see FIG. 1). The control unit 270 includes a switching unit 273 instead of the switching unit 173 (see FIG. 1), and further includes the storage register 275. The switching unit 273 is switched between a third state and a second state. The third state is a state in which first data stored in the capture register 62 or second data stored in the storage register 275 is supplied to the writing unit 166. The second state is a state in which the first data read out from a selected second memory bit cell or the second data read out from a selected first memory bit cell are supplied to the writing unit 166.

For example, the switching unit 273 includes n selectors SL4[0:n−1] in addition to n selectors SL3[0:n−1]. The selector SL4 selects the output of the storage register 275 and the output of the capture register 62 according to a select signal φSELECT2 and outputs the selected output to the selector SL3. When the select signal φSELECT2 is at a fourth level, the selector SL4 selects the output of the storage register 275 and outputs the output to the selector SL3, and when the select signal φSELECT2 is at a fifth level, the output of the capture register 62 is selected and output to the selector SL3.

The storage register 275 stores the data read out from the selected memory bit cell according to a storage timing signal φST. The control input generation circuit 34 sets the storage timing signal φST to be at the active level and supplies the signal to the storage register 275 at the timing when the storage register 275 stores the data. The storage register 275 stores the data read out from the selected memory bit cell in a period when the storage timing signal φST is at the active level. The storage register 275 has the same structure as that of the capture register 62, and for example includes the n registers RG[0:n−1] (see FIG. 11).

Figure 5:
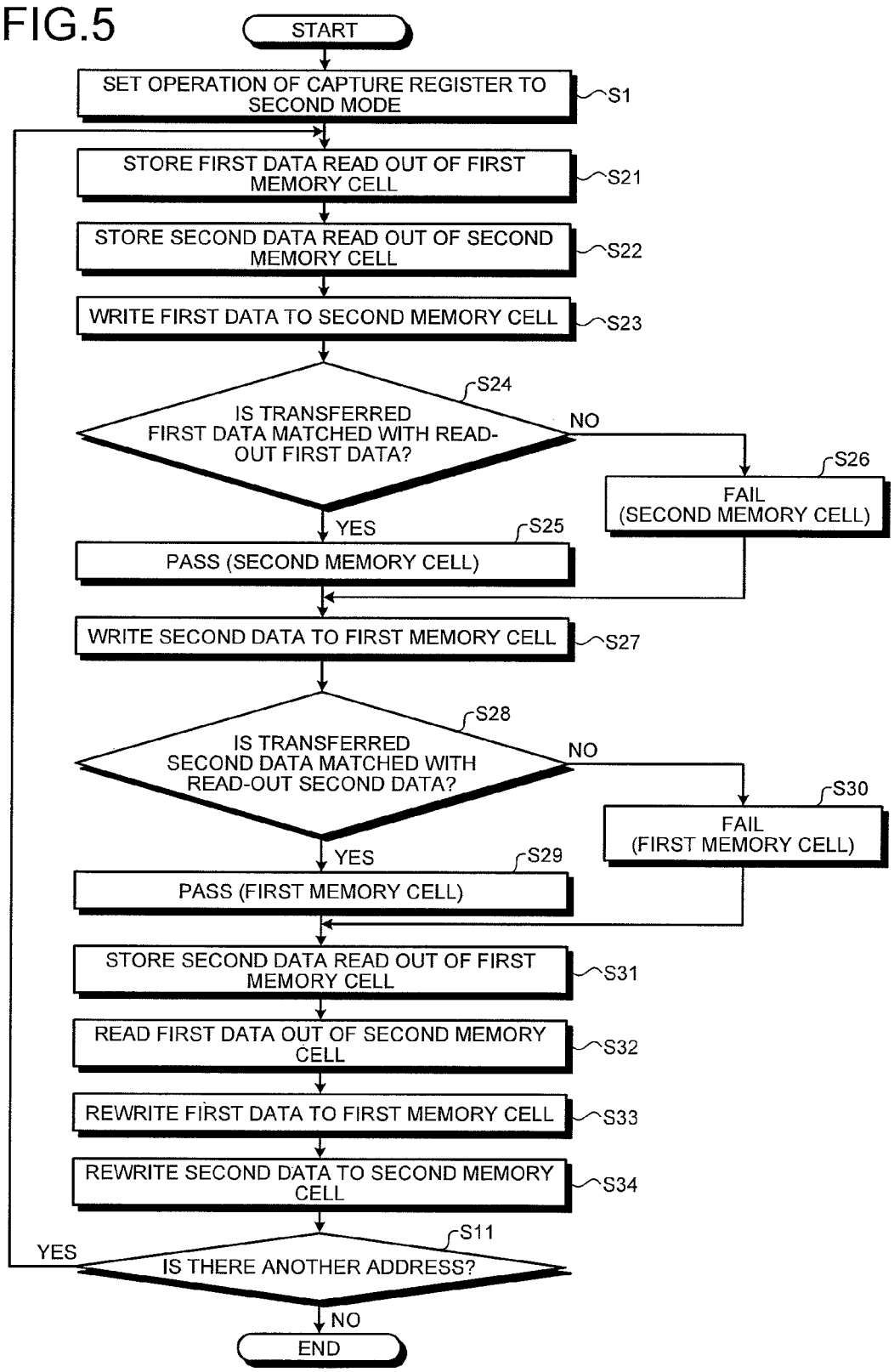
FIG. 5 is a flowchart illustrating an operation of the semiconductor integrated circuit according to the second embodiment.

Further, the operation of the semiconductor integrated circuit 200 is different from the first embodiment in the following points as illustrated in FIG. 5. FIG. 5 is a flowchart illustrating an operation of the semiconductor integrated circuit 200.

The self-test circuit 203 increases the BIST address counter in the address generation circuit 233 by 1, and designates the address AD11 at which the ISST is performed during the system operation. The comparator 171 reads first data D11 from the first memory bit cell selected at the address AD11, and the self-test circuit 203 sets all the bits of the expectation values De[0:n−1] to "0". Therefore, the comparator 171 stores the first data D11 read out from the first memory bit cell in the capture register 62 without any change (S21). The capture register 62 stores the first data D11 in a period when the capture timing signal φCP is at the active level. At this time, the storage timing signal φST comes to be at the non-active level, and the first data D11 is not stored in the storage register 275.

The self-test circuit 203, for example, increases the address AD11 to designate an address AD12 (="Address AD11"+1) at which the ISST is to be performed during the system operation. The comparator 171 reads second data D12 from the second memory bit cell selected at the address AD12. Therefore, the comparator 171 stores the second data D12 read out from the second memory bit cell in the storage register 275 (S22). The storage register 275 stores the second data D12 in a period when the storage timing signal φST is at the active level. At this time, the capture timing signal φCP comes to be at the non-active level, and the second data D12 is not stored in the capture register 62.

The self-test circuit 203 sets the select signal φSELECT to be at the first level and supplies the signal to the switching unit 273, and makes the switching unit 273 switched to the first state. The self-test circuit 203 sets the select signal φSELECT2 to be at the fifth level and supplies the signal to the switching unit 273, and causes the first data D11 stored in the capture register 62 to be supplied to the generation unit 172. Further, the self-test circuit 203 sets the invert control signal φINC to be at the non-active level (=bit value "0") and causes the generation unit 172 to supply the first data D11 to the writing unit 166 without being logically inverted. Therefore, the first data D11 is written to the second memory bit cell selected at the address AD12 (S23). In addition, the first data D11 to be written to the second memory bit cell is data related to the second data D12 written in the second memory bit cell, for example, in that the first data is data written in the first memory bit cell at the adjacent address.

The comparator 171 reads the first data D11 from the second memory bit cell selected at the address AD12, and the self-test circuit 203 sets all the bit values of the expectation values De[0:n−1] to "1". Therefore, the comparator 171 determines whether the first data D11 transferred from the generation unit 172 and the first data D11 read out from the selected second memory bit cell are matched with each other (S24). In a case where the first data D11 transferred from the generation unit 172 and the first data D11 read out from the selected second memory bit cell are matched with each other (Yes in S24), the comparator 171 outputs the bit value "0" indicating "Pass" as the comparison result CR to the capture register 62 to be stored therein (S25). The capture register 62 stores the comparison result CR in a period when the capture timing signal φCP is at the active level. In a case where the first data D11 transferred from the generation unit 172 and the first data D11 read out from the selected second memory bit cell are not matched with each other (No in S24), the comparator 171 outputs the bit value "1" indicating "Fail" as the comparison result CR to the capture register 62 to be stored therein (S26). The capture register 62 stores the comparison result CR in a period when the capture timing signal φCP is at the active level. Then, the completion signal φCOMP is set to be at the active level (see FIG. 11). Therefore, the flag generation circuit 64 generates the fail flag according to the comparison result CR and stores the flag in the flag register 65.

The self-test circuit 203 sets the select signal φSELECT2 to be at the fourth level and supplies the signal to the switching unit 273, and causes the second data D12 stored in the storage register 275 to be supplied to the generation unit 172. Further, the self-test circuit 203 sets the invert control signal φINC to be at the non-active level (=bit value "0") and causes the generation unit 172 to supply the second data D12 to the writing unit 166 without being logically inverted. Therefore, the second data D12 is written to the first memory bit cell selected at the address AD11 (S27). In addition, the second data D12 written to the first memory bit cell is data related to the first data D11 written in the first memory bit cell, for example, in that the second data is data written in the second memory bit cell at the adjacent address.

The comparator 171 reads the second data D12 from the first memory bit cell selected at the address AD11, and the self-test circuit 203 sets all the bit values of the expectation values De[0:n−1] to "1". Therefore, the comparator 171 determines whether the second data D12 transferred from the generation unit 172 and the second data D12 read out from the selected first memory bit cell are matched with each other (S28). In a case where the second data D12 transferred from the generation unit 172 and the second data D12 read out from the selected first memory bit cell are matched with each other (Yes in S28), the comparator 171 outputs the bit value "0" indicating "Pass" as the comparison result CR to the capture register 62 to be stored therein (S29). The capture register 62 stores the comparison result CR in a period when the capture timing signal φCP is at the active level. In a case where the second data D12 transferred from the generation unit 172 and the second data D12 read out from the selected first memory bit cell are not matched with each other (No in S28), the comparator 171 outputs the bit value "1" indicating "Fail" as the comparison result CR to the capture register 62 to be stored therein (S30). The capture register 62 stores the comparison result CR in a period when the capture timing signal φCP is at the active level. Then, the completion signal φCOMP is set to be at the active level (see FIG. 11). Therefore, the flag generation circuit 64 generates the fail flag according to the comparison result CR and stores the flag in the flag register 65.

The comparator 171 reads the second data D12 from the first memory bit cell selected at the address AD11. The self-test (BIST) circuit 203 sets the storage timing signal φST to be at the active level. Therefore, the comparator 171 stores the second data D12 read out from the first memory bit cell in the storage register 275 (S31). At this time, the capture timing signal φCP comes to be at the non-active level, and the second data D11 is not stored in the capture register 62.

The self-test (BIST) circuit 203 sets the select signal φSELECT to be at the second level and supplies the signal to the switching unit 273, and causes the switching unit 273 to be switched to the second state. The comparator 171 reads the first data D11 from the second memory bit cell selected at the address AD12 (S32).

The generation unit 172 supplies the first data D11 read out from the second memory bit cell to the writing unit 166. Accordingly, the writing unit 166 rewrites the first data D11 to the first memory bit cell selected at the address AD11 (S33).

The self-test circuit 203 sets the select signal φSELECT to be at the first level and supplies the signal to the switching unit 273, and causes the switching unit 273 to be switched to the first state. The self-test circuit 203 sets the select signal φSELECT2 to be at the fourth level and supplies the signal to the switching unit 273, and causes the second data D12 stored in the storage register 275 to be supplied to the generation unit 172. The generation unit 172 supplies the second data D12 to the writing unit 166. Accordingly, the writing unit 166 rewrites the second data D12 to the second memory bit cell selected at the address AD12 (S34).

As described above, in the second embodiment, the storage register 275 is provided in addition to the capture register 62, and the writing on a plurality of addresses in the memory 5 is sequentially performed using the data stored in each register. Therefore, it is possible to perform the test operation on the plurality of consecutive addresses in parallel and test the interference between the adjacent memory bit cells.

Figure 6:
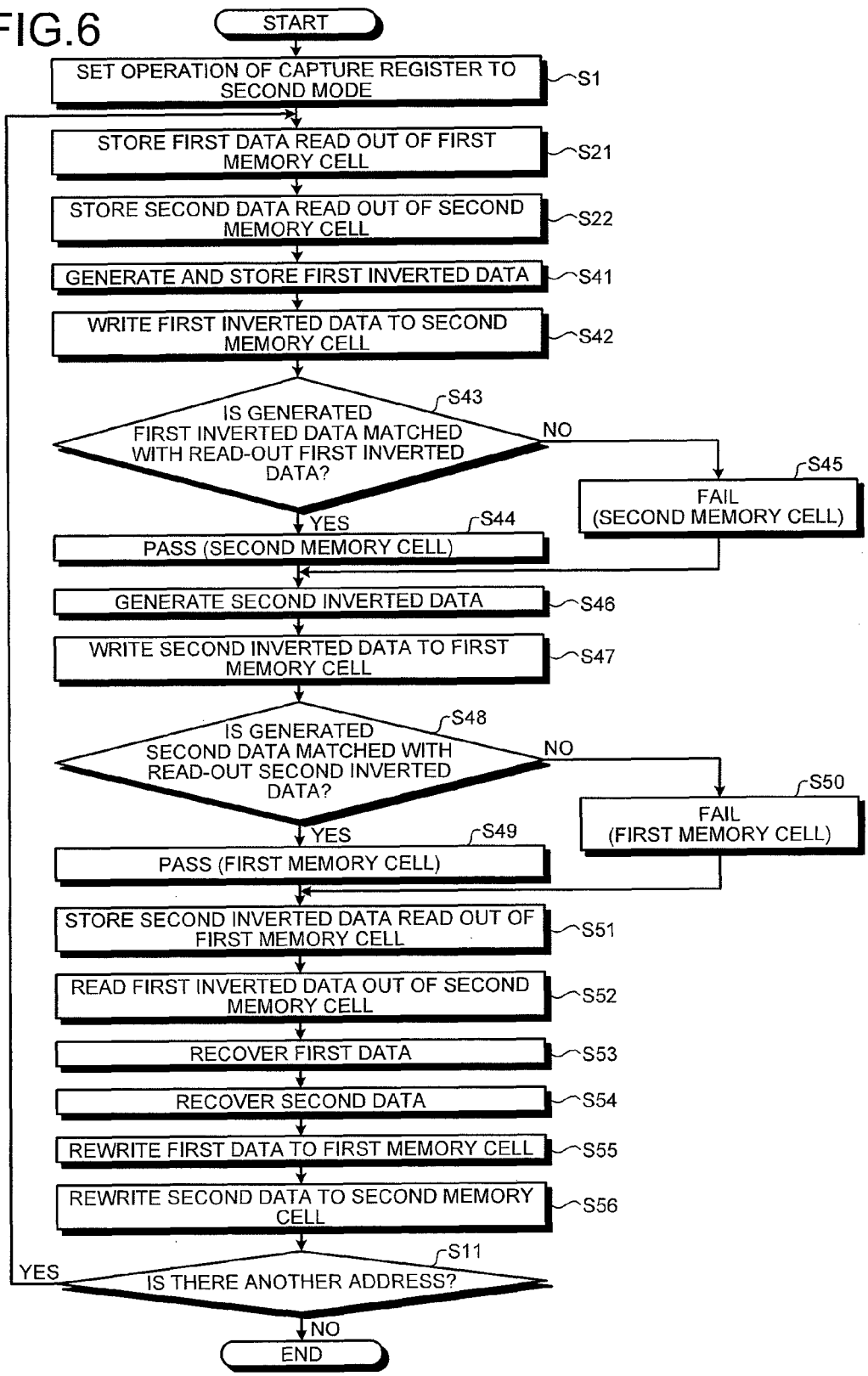
FIG. 6 is a flowchart illustrating an operation of a semiconductor integrated circuit according to a modified example of the second embodiment.

It should be noted that the data may be inverted at the time of being written in the memory bit cell. Specifically, the following operation may be performed as illustrated in FIG. 6. FIG. 6 is a flowchart illustrating an operation of a semiconductor integrated circuit according to a modified example of the second embodiment.

The self-test circuit 203 increases the BIST address counter in the address generation circuit 233 by 1 to designate the address AD11 at which the ISST is to be performed during the system operation. The comparator 171 reads the first data D11 from the first memory bit cell selected at the address AD11, and the self-test circuit 203 sets all the bit values of the expectation values De[0:n−1] to "0". Therefore, the comparator 171 stores the first data D11 read out from the first memory bit cell in the capture register 62 without any change (S21). The capture register 62 stores the first data D11 in a period when the capture timing signal φCP is at the active level. At this time, the storage timing signal φST comes to be at the non-active level, and the first data D11 is not stored in the storage register 275.

The self-test circuit 203, for example, increases the address AD11 to designate an address AD12 (="Address AD11"+1) at which the ISST is to be performed during the system operation. The comparator 171 reads second data D12 from the second memory bit cell selected at the address AD12. Therefore, the comparator 171 stores the second data D12 read out from the second memory bit cell in the storage register 275 (S22). The storage register 275 stores the second data D12 in a period when the storage timing signal φST is at the active level. At this time, the capture timing signal φCP comes to be at the non-active level, and the second data D12 is not stored in the capture register 62.

The self-test circuit 203 sets the select signal φSELECT to be at the first level and supplies the signal to the switching unit 273, and makes the switching unit 273 switched to the first state. The self-test circuit 203 sets the select signal φSELECT2 to be at the fifth level and supplies the signal to the switching unit 273, and causes the first data D11 stored in the capture register 62 to be supplied to the generation unit 172. Further, the self-test circuit 203 sets the invert control signal φINC to be at the active level. Accordingly, the generation unit 172 makes the first data D11 stored in the capture register 62 logically inverted to generate first inverted data ⁻D11, and supplies the generated data to the writing unit 166 (S41). Accordingly, the writing unit 166 writes the first inverted data ⁻D11 to the second memory bit cell selected at the address AD12 (S42). In addition, the first inverted data ⁻D11 to be written to the second memory bit cell is data related to the second data D12 written in the second memory bit cell, for example, in that the first inverted data is data obtained by logically inverting the data written in the first memory bit cell at the adjacent address.

The comparator 171 reads the first inverted data ⁻D11 from the second memory bit cell selected at the address AD12, and the self-test circuit 203 sets all the bit values of the expectation values De[0:n−1] to "1". Therefore, the comparator 171 determines whether the first inverted data ⁻D11 generated by the generation unit 172 and the first inverted data ⁻D11 read out from the selected second memory bit cell are matched with each other (S43). In a case where the first inverted data ⁻D11 generated by the generation unit 172 and the first inverted data ⁻D11 read out from the selected second memory bit cell are matched with each other (Yes in S43), the comparator 171 outputs the bit value "0" indicating "Pass" as the comparison result CR to the capture register 62 to be stored therein (S44). The capture register 62 stores the comparison result CR in a period when the capture timing signal φCP is at the active level. In a case where the first inverted data ⁻D11 generated by the generation unit 172 and the first inverted data ⁻D11 read out from the selected second memory bit cell are not matched with each other (No in S43), the comparator 171 outputs the bit value "1" indicating "Fail" as the comparison result CR to the capture register 62 to be stored therein (S45). The capture register 62 stores the comparison result CR in a period when the capture timing signal φCP is at the active level. Then, the completion signal φCOMP is set to be at the active level (see FIG. 11). Therefore, the flag generation circuit 64 generates the fail flag according to the comparison result CR and stores the flag in the flag register 65.

The self-test circuit 203 sets the select signal φSELECT2 to be at the fourth level and supplies the signal to the switching unit 273, and causes the second data D12 stored in the storage register 275 to be supplied to the generation unit 172. Further, the self-test circuit 203 sets the invert control signal φINC to be at the active level. Accordingly, the generation unit 172 makes the second data D12 stored in the storage register 275 logically inverted to generate second inverted data ⁻D12, and supplies the generated data to the writing unit 166 (S46). Accordingly, the writing unit 166 writes the second inverted data ⁻D12 to the first memory bit cell selected at the address AD11 (S47). In addition, the second inverted data ⁻D12 to be written to the first memory bit cell is data related to the first data D11 written in the first memory bit cell, for example, in that the second inverted data is data obtained by logically inverting the data written in the second memory bit cell at the adjacent address.

The comparator 171 reads the second inverted data ⁻D12 from the first memory bit cell selected at the address AD11, and the self-test circuit 203 sets all the bit values of the expectation values De[0:n−1] to "1". Therefore, the comparator 171 determines whether the second inverted data ⁻D12 generated by the generation unit 172 and the second inverted data ⁻D12 read out from the selected first memory bit cell are matched with each other (S48). In a case where the second inverted data ⁻D12 generated by the generation unit 172 and the second inverted data ⁻D12 read out from the selected first memory bit cell are matched with each other (Yes in S48), the comparator 171 outputs the bit value "0" indicating "Pass" as the comparison result CR to the capture register 62 to be stored therein (S49). The capture register 62 stores the comparison result CR in a period when the capture timing signal φCP is at the active level. In a case where the second inverted data ⁻D12 generated by the generation unit 172 and the second inverted data ⁻D12 read out from the selected first memory bit cell are not matched with each other (No in S48), the comparator 171 outputs the bit value "1" indicating "Fail" as the comparison result CR to the capture register 62 to be stored therein (S50). The capture register 62 stores the comparison result CR in a period when the capture timing signal φCP is at the active level. Then, the completion signal φCOMP is set to be at the active level (see FIG. 11). Therefore, the flag generation circuit 64 generates the fail flag according to the comparison result CR and stores the flag in the flag register 65.

The comparator 171 reads the second inverted data ⁻D12 from the first memory bit cell selected at the address AD11. The self-test (BIST) circuit 203 sets the storage timing signal φST to be at the active level. Therefore, the comparator 171 stores the second inverted data ⁻D12 read out from the first memory bit cell in the storage register 275 (S51). At this time, the capture timing signal φCP comes to be at the non-active level, and the second inverted data ⁻D12 is not stored in the capture register 62.

The self-test (BIST) circuit 203 sets the select signal φSELECT to be at the second level and supplies the signal to the switching unit 273, and causes the switching unit 273 to be switched to the second state. The comparator 171 reads the first inverted data ⁻D11 from the second memory bit cell selected at the address AD12 (S52).

The generation unit 172 makes the first inverted data ⁻D11 read out from the second memory bit cell logically inverted, and recovers and supplies the original first data D11 to the writing unit 166 (S53). Accordingly, the writing unit 166 rewrites the first data D11 to the first memory bit cell selected at the address AD11 (S55).

The self-test circuit 203 sets the select signal φSELECT to be at the first level and supplies the signal to the switching unit 273, and causes the switching unit 273 to be switched to the first state. The self-test circuit 203 sets the select signal φSELECT2 to be at the fourth level and supplies the signal to the switching unit 273, and causes the second inverted data ⁻D12 stored in the storage register 275 to be supplied to the generation unit 172. The generation unit 172 makes the second inverted data ⁻D12 logically inverted, and recovers and supplies the original second data D12 to the writing unit 166 (S54). Accordingly, the writing unit 166 rewrites the second data D12 to the second memory bit cell selected at the address AD12 (S56).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a memory which includes a plurality of memory bit cells;
   a self-test circuit which controls write operation and read operation to/from the memory, the self-test circuit being able to output an expectation value;
   a capture register which, according to control state of the self-test circuit, stores data read out from a memory bit cell selected by the self-test circuit or comparison result that is obtained by comparing data read out from a memory bit cell selected by the self-test circuit with the expectation value output from the self-test circuit;
   a writing unit which, according to control state of the self-test circuit, writes the data stored in the capture register or data processed from the stored data or data read out from a memory bit cell selected by the self-test circuit, to the memory bit cell; and
   a control unit which, according to control state of the self-test circuit, generates the processed data to be written to the memory bit cell by the writing unit, outputs the processed data read out from the memory bit cell selected by the self-test circuit to the capture register, compares the processed data stored in the capture register and the processed data generated by the control unit, output a result of the comparison to the capture register to be overwritten as a self-test result about the memory bit cell, restores an original data from data read out from the memory bit cell selected by the self-test circuit, and outputs the restored original data to be rewritten to the memory bit cell selected by the self-test circuit.

2. The semiconductor integrated circuit according to claim 1,
   wherein the control unit includes a generation unit which makes the data stored in the capture register logically inverted to generate inverted data,
   wherein the writing unit writes the generated inverted data to the selected memory bit cell, and
   wherein the control unit further includes
   a comparator which compares the inverted data read out from the selected memory bit cell and the generated inverted data and outputs a comparison result as the self-test result about the selected memory bit cell to the capture register, and
   a first switching unit which is switched between a first state of supplying the stored data to the generation unit and a second state of supplying the inverted data read out from the selected memory bit cell to the generation unit.

3. The semiconductor integrated circuit according to claim 2,
   wherein the control unit further includes
   a second switching unit which switches the operation of the capture register between a first mode of accumulating and storing a comparison result received from the comparator and a second mode of storing a comparison result received from the comparator without accumulating the comparison result, and
   wherein the self-test circuit controls the second switching unit such that test data is supplied to the plurality of memory bit cells and the operation is switched to the first mode when a system to control the plurality of memory bit cells is powered up, and controls the second switching unit such that the test data is not supplied to the plurality of memory bit cells and the operation is switched to the second mode during a period when the system is operated.

4. The semiconductor integrated circuit according to claim 3,
wherein the second switching unit switches the operation of the capture register between the first mode and the second mode according to self-test signal which is supplied from the self-test circuit.

5. The semiconductor integrated circuit according to claim 4,
wherein the second switching unit switches the operation to the first mode when the self-test signal is at a non-active level, and switches the operation to the second mode when the self-test signal is at an active level.

6. The semiconductor integrated circuit according to claim 5,
wherein the second switching unit includes
a logical inversion operator which makes the self-test signal logically inverted, and
a logical multiplication operator which performs a logical multiplication operation between the logically-inverted self-test signal and the output of the capture register, and
wherein an output terminal of the logical multiplication operator is connected to an input of the capture register.

7. The semiconductor integrated circuit according to claim 3,
wherein the self-test circuit causes the first switching unit to be switched to the first state so that the comparator outputs the comparison result to the capture register during the operation of the system, and after the comparator completely outputs the comparison result to the capture register, causes the first switching unit to be switched to the second state so that the read-out data is rewritten to the selected memory bit cell.

8. The semiconductor integrated circuit according to claim 7,
wherein the first switching unit is switched between the first state and the second state according to a first select signal supplied from the self-test circuit.

9. The semiconductor integrated circuit according to claim 8,
wherein the first switching unit is switched to the first state when the first select signal is at a first level, and switched to the second state when the first select signal is at a second level.

10. The semiconductor integrated circuit according to claim 7,
wherein the first switching unit is switched to the first state, the second state, or a third state in which a fixed bit value "0" is supplied to the generation unit according to a first select signal supplied from the self-test circuit.

11. The semiconductor integrated circuit according to claim 10,
wherein the first switching unit is switched to the first state when the first select signal is at a first level, and switched to the second state when the first select signal is at a second level, and switched to the third state when the first select signal is at a third level.

12. The semiconductor integrated circuit according to claim 2,
wherein when the inverted data read out from the selected memory bit cell and the generated inverted data are matched with each other, the comparator outputs a comparison result which indicates "Pass", and
wherein when the inverted data read out from the selected memory bit cell and the generated inverted data are not matched with each other, the comparator outputs a comparison result which indicates "Fail".

13. A semiconductor integrated circuit comprising:
a memory which includes a plurality of memory bit cells;
a self-test circuit which controls write operation and read operation to/from the memory, the self-test circuit being able to output an expectation value;
a capture register which, according to control state of the self-test circuit, stores data read out from a memory bit cell selected by the self-test circuit or comparison result that is obtained by comparing data read out from a memory bit cell selected by the self-test circuit with the expectation value output from the self-test circuit;
a writing unit which, according to control state of the self-test circuit, writes the data stored in the capture register or data processed from the stored data or data read out from a memory bit cell selected by the self-test circuit, to the memory bit cell; and
a control unit which, according to control state of the self-test circuit, generates the processed data to be written to the memory bit cell by the writing unit, outputs the processed data read out from the memory bit cell selected by the self-test circuit to the capture register, compares the processed data stored in the capture register and the processed data generated by the control unit, outputs a result of the comparison to the capture register to be overwritten as a self-test result about the memory bit cell, restores an original data from data read out from the memory bit cell selected by the self-test circuit, and outputs the restored original data to be rewritten to the memory bit cell selected by the self-test circuit,
wherein the capture register stores first data which is read out from a first memory bit cell selected out of the plurality of memory bit cells,
wherein the control unit includes a register which stores second data read out from a second memory bit cell selected out of the plurality of memory bit cells,
wherein the writing unit writes the first data stored in the capture register to the selected second memory bit cell, and writes the second data stored in the register to the selected first memory bit cell, and
wherein the control unit further includes
a comparator which compares the first data read out from the selected second memory bit cell and the first data stored in the capture register, outputs a comparison result to the capture register as a self-test result about the selected second memory bit cell, compares the second data read out from the selected first memory bit cell and the second data stored in the register, and outputs a comparison result to the capture register as a self-test result about the selected first memory bit cell, and
a third switching unit which is switched between a first state of supplying the first data stored in the capture register or the second data stored in the register to the writing unit and a second state of supplying the first data read out from the selected second memory bit cell or the second data read out from the selected first memory bit cell to the writing unit.

14. The semiconductor integrated circuit according to claim 13,
wherein the control unit further includes
a second switching unit which switches the operation of the capture register between a first mode of accumulating and storing the comparison result received from the comparator and a second mode of storing the comparison result received from the comparator without accumulating the comparison result, and wherein the self-test circuit controls the second switching unit such that test data is supplied to the plurality of memory bit cells and the operation is switched to the first mode when a system to control the plurality of memory bit cells is powered up, and controls the second switching unit such that the test data is not supplied to the plurality of memory bit cells and the operation is switched to the second mode during a period when the system is operated, and wherein the self-test circuit selects the first memory bit cell and the second memory bit cell respectively among the plurality of memory bit cells when the operation is switched to the second mode.

15. The semiconductor integrated circuit according to claim 14,
wherein the self-test circuit generates a first address which is used to select the first memory bit cell and a second address which is used to select the second memory bit cell as consecutive counter values.

16. The semiconductor integrated circuit according to claim 14,
wherein the self-test circuit causes the first switching unit to be switched to the first state so that the comparator outputs the comparison result to the capture register during the operation of the system, and after the comparator completely outputs the comparison result to the capture register, causes the first switching unit to be switched to the second state so that the read-out first data is rewritten to the selected first memory bit cell and the read-out second data is rewritten to the selected second memory bit cell.

17. The semiconductor integrated circuit according to claim 16,
wherein the third switching unit is switched between the first state and the second state according to a first select signal supplied from the self-test circuit, and switched between a state where the output of the register in the second state is supplied to the writing unit and a state where the output of the capture register is supplied to the writing unit according to a second select signal.

18. The semiconductor integrated circuit according to claim 17,
wherein the third switching unit includes
a first selector which is switched to the first state when the first select signal is at a first level, and switched to the second state when the first select signal is at a second level, and
a second selector which selects the output of the register and outputs the output to the first selector when the second select signal is at a fourth level, and selects the output of the capture register and outputs the output to the first selector when the second select signal is at a fifth level.

19. The semiconductor integrated circuit according to claim 13,
wherein the control unit further includes a generation unit which logically inverts the first data stored in the capture register to generate first inverted data, and logically inverts the second data stored in the register to generate second inverted data,
wherein the writing unit writes the generated first inverted data to the selected second memory bit cell, and writes the generated second inverted data to the selected first memory bit cell,
wherein the comparator compares the first inverted data read out from the selected second memory bit cell and the generated first inverted data and outputs a comparison result as the self-test result about the selected second memory bit cell to the capture register, and compares the second inverted data read out from the selected first memory bit cell and the generated second inverted data and outputs a comparison result as the self-test result about the selected first memory bit cell to the capture register, and
wherein the third switching unit is switched between a first state of supplying the first data stored in the capture register or the second data stored in the register to the generation unit, and a second state of supplying the first inverted data read out from the selected second memory bit cell or the second inverted data read out from the selected first memory bit cell to the generation unit.

20. The semiconductor integrated circuit according to claim 19,
wherein the control unit further includes
a second switching unit which switches the operation of the capture register between a first mode of accumulating and storing the comparison result received from the comparator and a second mode of storing the comparison result received from the comparator without accumulating the comparison result, and
wherein the self-test circuit controls the second switching unit such that test data is supplied to the plurality of memory bit cells and the operation is switched to the first mode when a system to control the plurality of memory bit cells is powered up, and controls the second switching unit such that the test data is not supplied to the plurality of memory bit cells and the operation is switched to the second mode during a period when the system is operated, and
wherein the self-test circuit selects the first memory bit cell and the second memory bit cell in parallel among the plurality of memory bit cells when the operation is switched to the second mode.

* * * * *